United States Patent [19]

Takahashi et al.

[11] Patent Number: 5,760,421
[45] Date of Patent: Jun. 2, 1998

[54] SEMICONDUCTOR DEVICE INCLUDING INDICES FOR IDENTIFYING POSITIONS OF ELEMENTS IN THE DEVICE.

[75] Inventors: Hidekazu Takahashi, Isehara; Hideshi Kuwabara, Zama, both of Japan

[73] Assignee: Canon Kabushiki Kaisha, Tokyo, Japan

[21] Appl. No.: 739,061

[22] Filed: Oct. 28, 1996

Related U.S. Application Data

[63] Continuation of Ser. No. 542,429, Oct. 12, 1995, abandoned, which is a continuation of Ser. No. 257,662, Jun. 8, 1994, abandoned.

[30] Foreign Application Priority Data

Jun. 10, 1993 [JP] Japan .................. 5-163871
May 31, 1994 [JP] Japan .................. 6-117945

[51] Int. Cl.⁶ .................................. H01L 23/544
[52] U.S. Cl. ............... 257/59; 257/734; 257/750; 257/797
[58] Field of Search ............... 257/59, 72, 786, 257/797, 734, 750, 773; 359/54, 88, 87, 89

[56] References Cited

U.S. PATENT DOCUMENTS

| | | |
|---|---|---|
| 4,343,877 | 8/1982 | Chiang ..................... 257/48 |
| 5,216,280 | 6/1993 | Tanaka et al. ............ 257/784 |
| 5,300,815 | 4/1994 | Rostoker ................... 257/786 |
| 5,341,012 | 8/1994 | Misawa et al. ............ 257/72 |
| 5,391,920 | 2/1995 | Tsuji ........................ 257/758 |

FOREIGN PATENT DOCUMENTS

| | | | |
|---|---|---|---|
| 0126623 | 7/1984 | Japan ............ 257/72 |
| 0212050 | 9/1986 | Japan ............ 257/786 |
| 0104377 | 5/1988 | Japan ............ 257/448 |
| 0310548 | 12/1989 | Japan ............ 257/786 |
| 0335519 | 12/1993 | Japan ............ 257/797 |

*Primary Examiner*—Peter Toby Brown
*Attorney, Agent, or Firm*—Fitzpatrick, Cella, Harper & Scinto

[57] ABSTRACT

A semiconductor device having a plurality of elements arranged in a one-dimensional or a two-dimensional array includes indices for identifying positions of elements in the device formed in at least one of a horizontal direction and a vertical direction on a semiconductor layer externally of the array of the elements. The indices comprise contact sections connecting different layers of different configurations. The indices can be through-holes or contacts of different shapes, which are different in shape at every 10n-th row and every 100m-th column of the array of the semiconductor elements for use as the addresses of the elements.

9 Claims, 21 Drawing Sheets

5,760,421

1

SEMICONDUCTOR DEVICE INCLUDING INDICES FOR IDENTIFYING POSITIONS OF ELEMENTS IN THE DEVICE.

This application is a continuation of application Ser. No. 08/542,429, filed Oct. 12, 1995, which application is a continuation of application Ser. No. 08/257,662, filed Jun. 8, 1994, both now abandoned.

BACKGROUND OF THE INVENTION

1. Field of the Invention

The present invention relates to a semiconductor device having a plurality of semiconductor elements arranged in one-dimension or two dimensions, and more particularly to a semiconductor device having a plurality of pixels.

The present invention also relates to an apparatus for manufacturing a semiconductor device having a transport apparatus for a semiconductor wafer, and more particularly to a wafer transport apparatus for operating a plurality of wafer carriers.

2. Related Background Art

Semiconductor devices having a plurality of semiconductor elements arranged in one dimension or two dimensions with the same pattern include a photo-electric conversion device, a liquid crystal display device and a semiconductor memory device. As an example of such semiconductor devices, an XY addressing area sensor which is a photo-electric conversion device is explained below.

FIG. 9 shows a schematic circuit diagram area sensor. In FIG. 9, numeral 31 denotes a photo-electric conversion element, numeral 32 denotes a horizontal scan circuit, numeral 33 denotes a vertical scan circuit, numeral 34 denotes a vertical output line and numeral 35 denotes a horizontal drive line.

FIG. 10 shows a circuit diagram of the photo-electric conversion element 31. A plurality of photo-electric conversion elements are arranged in X and Y directions. A number of such photo-electric conversion elements are arranged as pixels with a total number of pixels being from several tens of thousands to several millions. FIG. 11 shows an enlarged view of a portion circled by broken lines in FIG. 9. In FIG. 11, numeral 36 denotes an AL2 layer wiring which is a power supply line, numeral 37 denotes an AL1 wiring, numeral 38 denotes a through-hole (TH) which connects the AL1 and AL2, and numeral 39 denotes a contact (CNT) for connecting the AL1 and a substrate. $S_{11}$, $S_{12}$, $S_{13}$, ... denote photo-electric conversion elements. By applying a potential to the power supply line, the potential is applied to the substrate through the through-hole TH 38, the AL1 layer wiring 37 and the contact CNT 39.

FIGS. 16A and 16B illustrate structures of a transport apparatus of the semiconductor wafer and an operation thereof. FIG. 16A shows a side view and FIG. 16B shows a top view. In FIGS. 16A and 16B, numeral 105 denotes a wafer and numeral 101 denotes a wafer chuck head. In the past, such a transport apparatus is commonly used in a wafer transport system of a semiconductor manufacturing apparatus such as a vertical diffusion oven or a CVD apparatus and it offers an advantage of simplicity in the structure and control more than a transport system which uses a robot because control coordinates (movement system) are limited to r, θ and Z.

FIGS. 17A and 17B show schematic constructions of a prior art wafer transport apparatus having a plurality of wafer carriers. FIG. 17A shows a side view and FIG. 17B

2 shows a top view. In FIGS. 17A and 17B, numeral 101 denotes a wafer chuck head, numeral 102 denotes a wafer carrier, numeral 103 denotes an upper wafer carrier table, numeral 104 denotes a lower wafer carrier table and numeral 105 denotes a wafer.

The oxidization, diffusion and film forming processes are usually batch-processed for 50–100 wafers. For example, for a carrier containing 25 wafers, a plurality (4–6) of carriers are required so that they are arranged in two or three vertical stages.

When the wafer carriers are to be set, it is difficult to take out the lower carrier if the two carriers are overlapped and it is usually moved by a swing arm.

FIG. 18 shows a top view for illustrating the movement of the carrier by such a swing arm. In FIG. 18, the lower wafer carrier table 104 is moved to the position of the wafer chuck head 101 by the lower swing arm 107, and the upper carrier table 103 is also moved by the upper swing arm 106.

Portions above a line A–A' shown in FIG. 18 are housed in the semiconductor manufacturing apparatus in order to prevent the contamination by particles.

In the semiconductor device having a number of semiconductor elements arranged as explained in connection with the prior art, the patterns are usually the same. Thus, if a fault occurs in a part of the elements, it is difficult to identify the fault element, which causes a big problem in fault analysis.

In the semiconductor manufacturing apparatus having the wafer transport apparatus as explained in FIG. 18, the wafer carrier is set externally of the semiconductor manufacturing apparatus (below the line A–A' in FIG. 18). If the uppermost wafer carrier is set or removed while a plurality of swing arms are left outside, particles drop onto the lower wafer carrier.

SUMMARY OF THE INVENTION

It is an object of the present invention to provide a semiconductor device having a plurality of semiconductor elements arranged, which facilitates the identification of a position of a particular semiconductor element.

It is another object of the present invention to provide a semiconductor wafer transport apparatus for moving a plurality of wafer carriers, which does not contaminate other wafers while one wafer is moved in or out.

As means for solving the above problems, the present invention provides a semiconductor device having a plurality of elements arranged in a one-dimensional or a two-dimensional array, wherein indices for identifying positions of elements in the chip are formed in at least one of a horizontal direction and a vertical direction on a semiconductor layer externally of the array of the elements.

The indices for identifying the positions in the chip may be formed by a wiring material and function as wiring.

The indices may be through-holes of different shapes.

Alternatively, the indices may be contacts of different shapes.

Alternatively, indices may be formed by omitting through-holes or contacts at specified positions.

The element may be pixels and the semiconductor device may be a photo-electric conversion device.

The present invention further provides a semiconductor manufacturing apparatus having a wafer transport apparatus including a plurality of wafer carriers comprising means for controlling said wafer carriers such that a wafer carrier is not

3 positioned under another wafer carrier at a wafer set position of said wafer carriers.

It may further comprise means for inhibiting a plurality of swing arms for supporting the wafer carriers from being simultaneously driven.

Alternatively it may further comprise means for permitting simultaneous operation of the swing arms for supporting said wafer carriers in the opposite outward and inward directions to said semiconductor manufacturing apparatus.

In accordance with the present invention, since an index for specifying an address is provided externally of the semiconductor elements, the position of the fault pixel can be exactly specified in a short time.

Further, in accordance with the present invention, the simultaneous move-out of the upper and lower swing arms is electrically or mechanically inhibited to prevent particle contamination from the upper wafer carrier to the lower wafer carrier.

4

Figure 22:
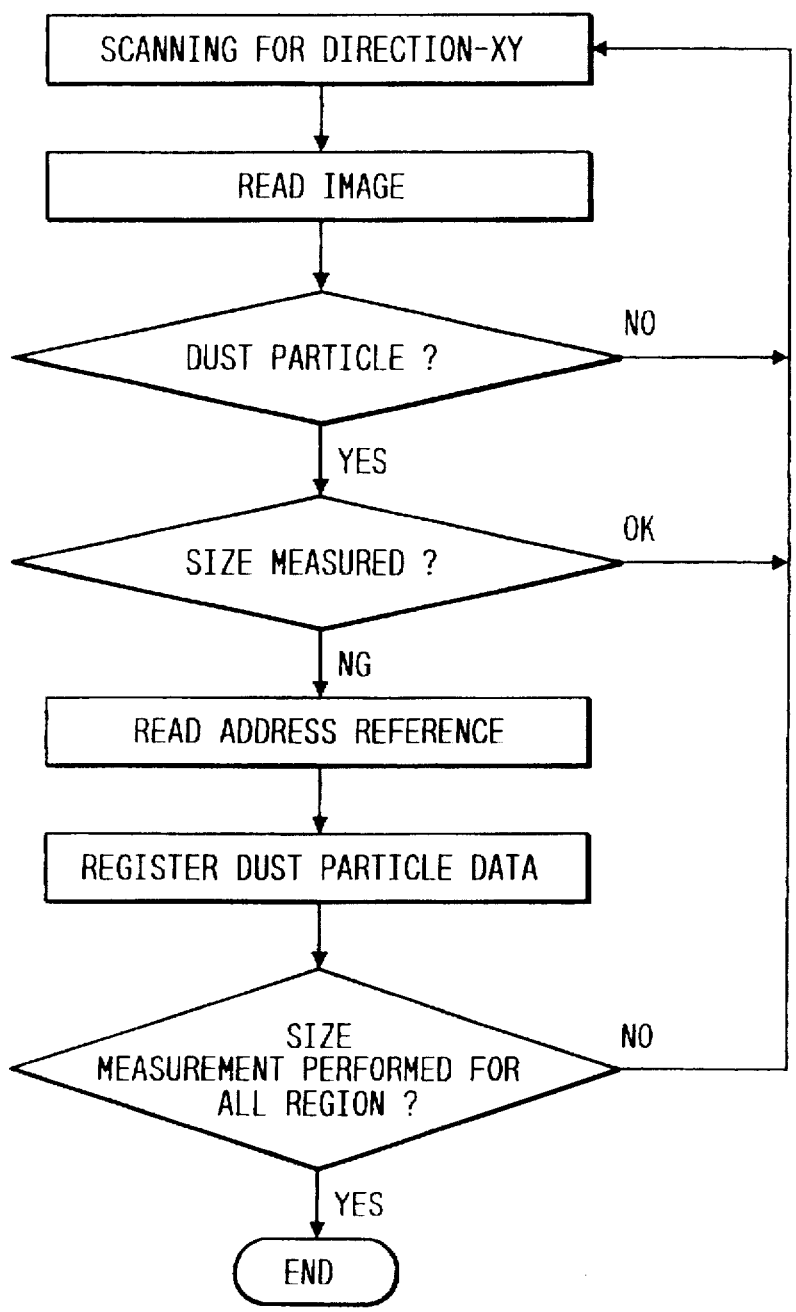
Figure 23:
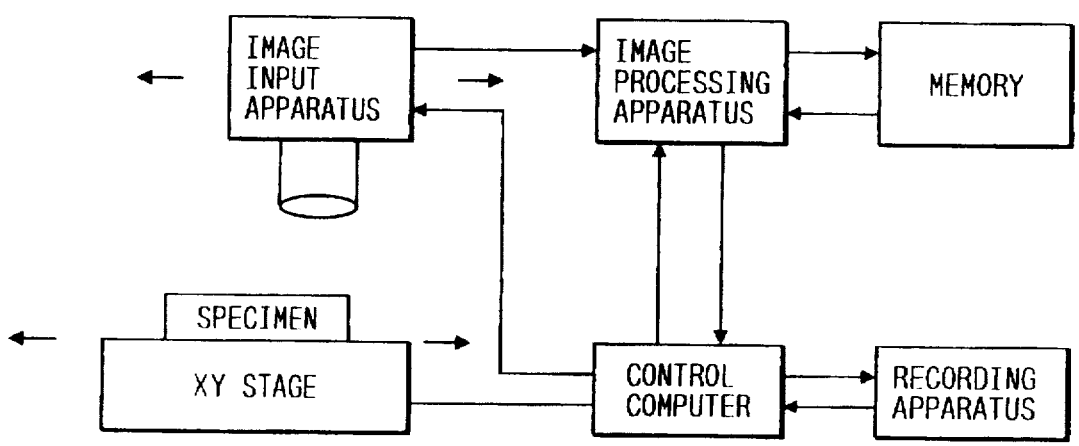

FIG. 22 shows a plan view of the eighth embodiment of the liquid crystal display device of the present invention, and FIG. 23 shows a plan view of the eighth embodiment of the liquid crystal display device of the present invention.

DESCRIPTION OF THE PREFERRED EMBODIMENTS

Embodiment 1

Figure 1:
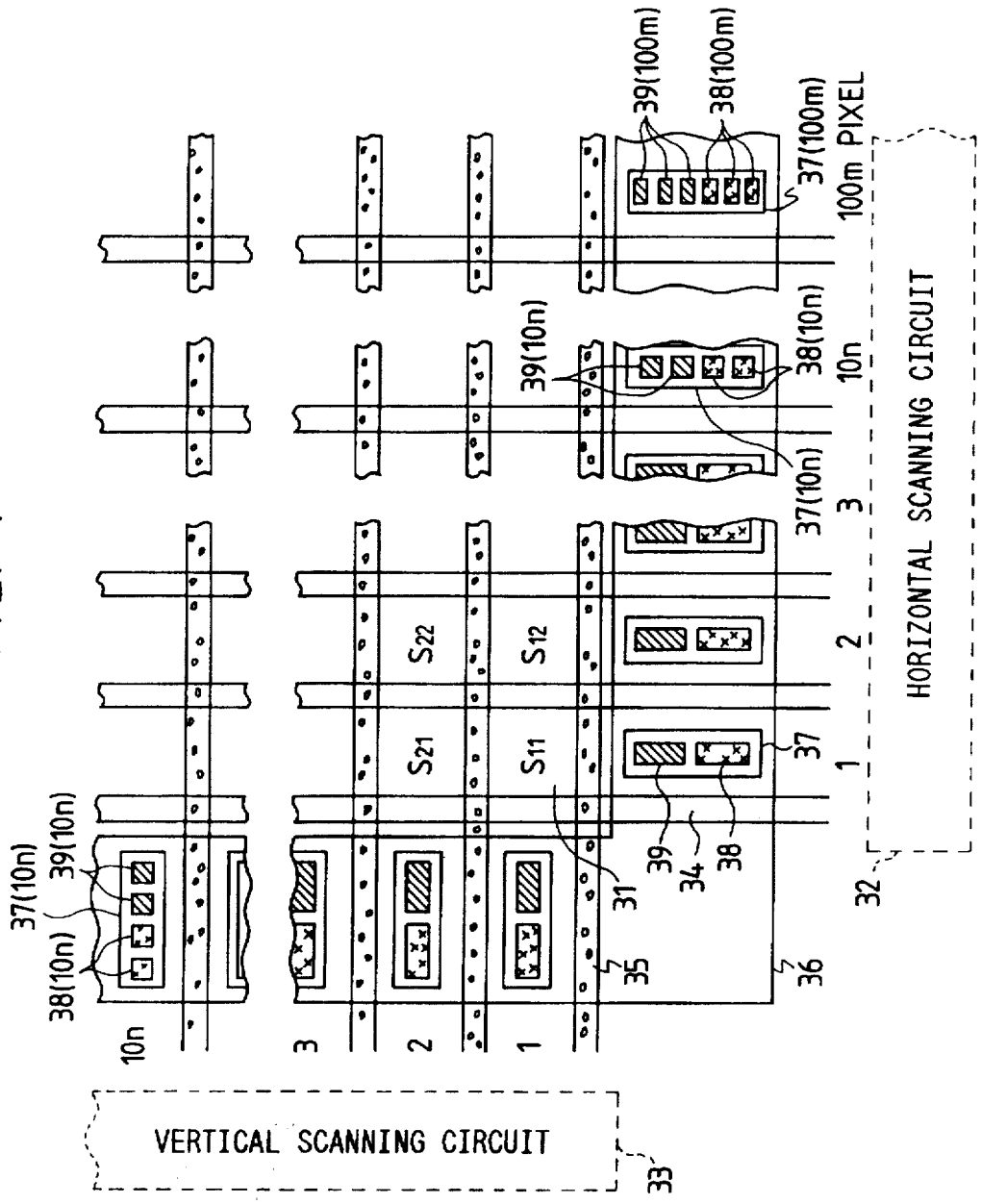
FIG. 1 shows a plan view of a first embodiment of a photo-electric conversion apparatus of the present invention.

FIG. 1 shows a plan view of a pattern of a photo-electric conversion device of a first embodiment of the present invention.

In FIG. 1, numeral 31 denotes a pixel, numeral 32 denotes a horizontal scan circuit, numeral 33 denotes a vertical scan circuit, numeral 34 denotes an AL1 layer wiring which is a vertical output line, numeral 35 denotes a poly-Si or silicide wiring which is a horizontal drive line, numeral 36 denotes an AL2 layer wiring which is a power supply line, numeral 37 denotes an AL1 layer wiring, numeral 38 denotes a through-hole (TH) which connects the power supply line 36 and the AL1 layer wiring 37 and numeral 39 denotes a contact (CNT) which connects the AL1 layer wiring and a substrate Si. A potential of the power supply line 36 is applied to the substrate through the through-hole TH 38, the AL1 layer wiring 37 and the contact CNT 39.

A signal of each column is transferred to the horizontal scan circuit 32 by the scan of the vertical scan circuit 33, and then the signals are sequentially outputted by the scan of the horizontal scan circuit 32.

In the present embodiment, an index for identifying a position of each pixel is defined by changing a pattern of the wiring layer (AL1 layer 37, through-hole TH 38 and contact CNT 39) which connects the power supply line located at an address of the 10-th horizontal line (n=1, 2, 3, . . . ) and the 100m-th vertical line (m=1, 2, 3, . . . ) and the substrate. Since the through-hole TH 38 and the contact CNT 39 serve to supply the substrate potential, the size and shape thereof may be changed without affecting the characteristic of the elements.

Further, since it is the change in only the through-hole TH process and the contact CNT process which have heretofore not been used, an increase of the chip size is not involved.

In the present embodiment, since the layer which has heretofore been used as the wiring layer is patterned to identify the address so that it may be used as the index, the photo-electric conversion device facilitates the fault analysis without an increase of the chip cost and the size and the change of the process. In the present embodiment, the address index is formed at the 10n-th line and the 100m-th line (n, m=1, 2, 3, . . . ) although they may be changed to the 5n-th line (every fifth line) or 50n-th line (every 50th line).

Instead of changing both the contact CNT and the through-hole TH, only one of the contact CNT or the through-hole TH, or the wiring pattern such as the AL1 may be changed to attain the same effect.

Embodiment 2

Figure 2:
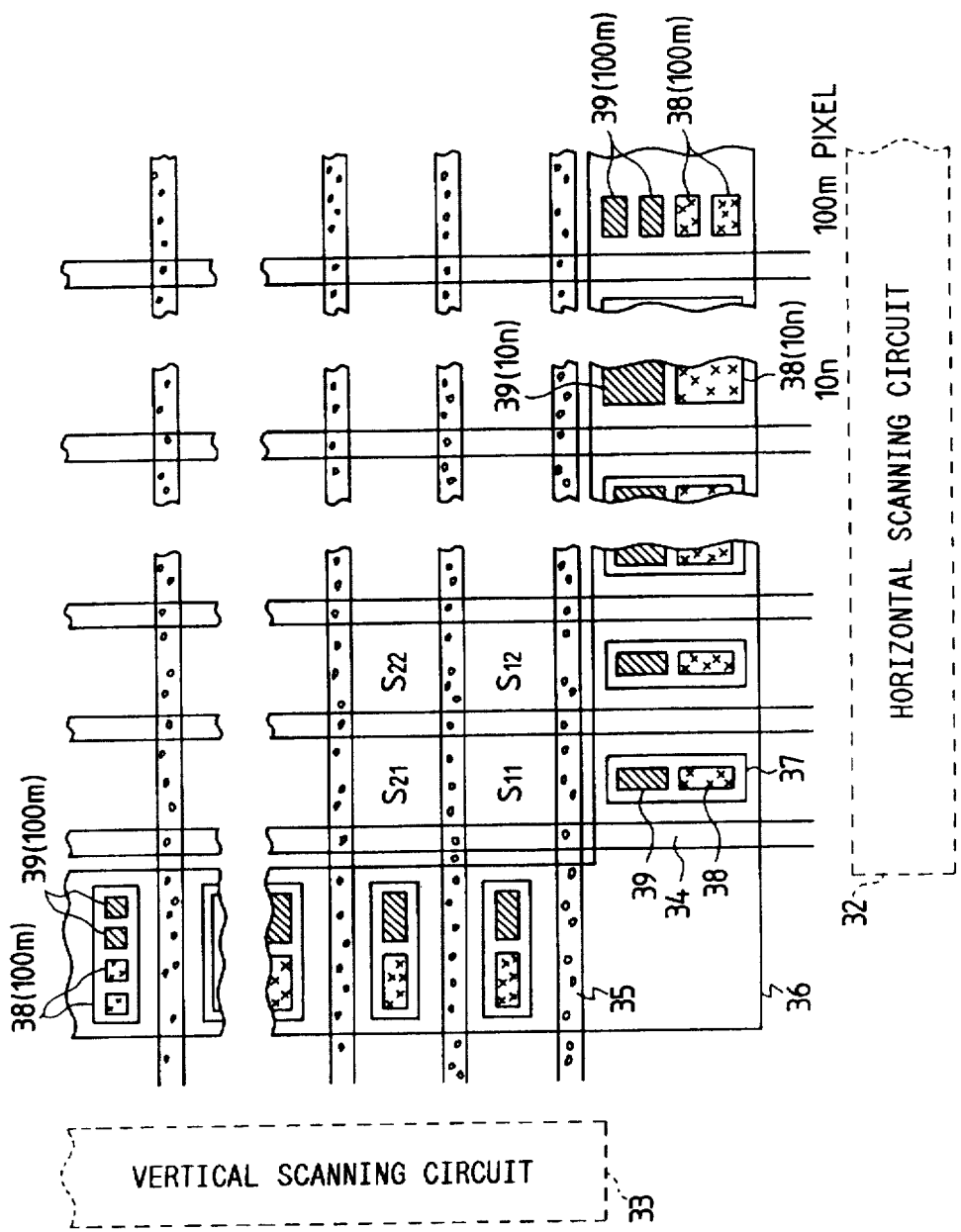
FIG. 2 shows a plan view of a second embodiment of the photo-electric conversion apparatus of the present invention.

FIG. 2 shows a second embodiment of the present invention. In FIG. 2, like elements to those of the first embodiment designated by the like numerals and the explanation thereof is omitted.

In the first embodiment, the address index has a function of wiring. In the present embodiment, the shapes of the through-hole TH 38 and the contact 39 are changed at the 10n-th line and the 100m-th line to impart only the address function.

In the present embodiment, the address index is formed by using the AL1 layer wiring. In the present embodiment, the address identification of the pixel may be attained more exactly and in a shorter time than those of the prior art.

Embodiment 3

Figure 3:
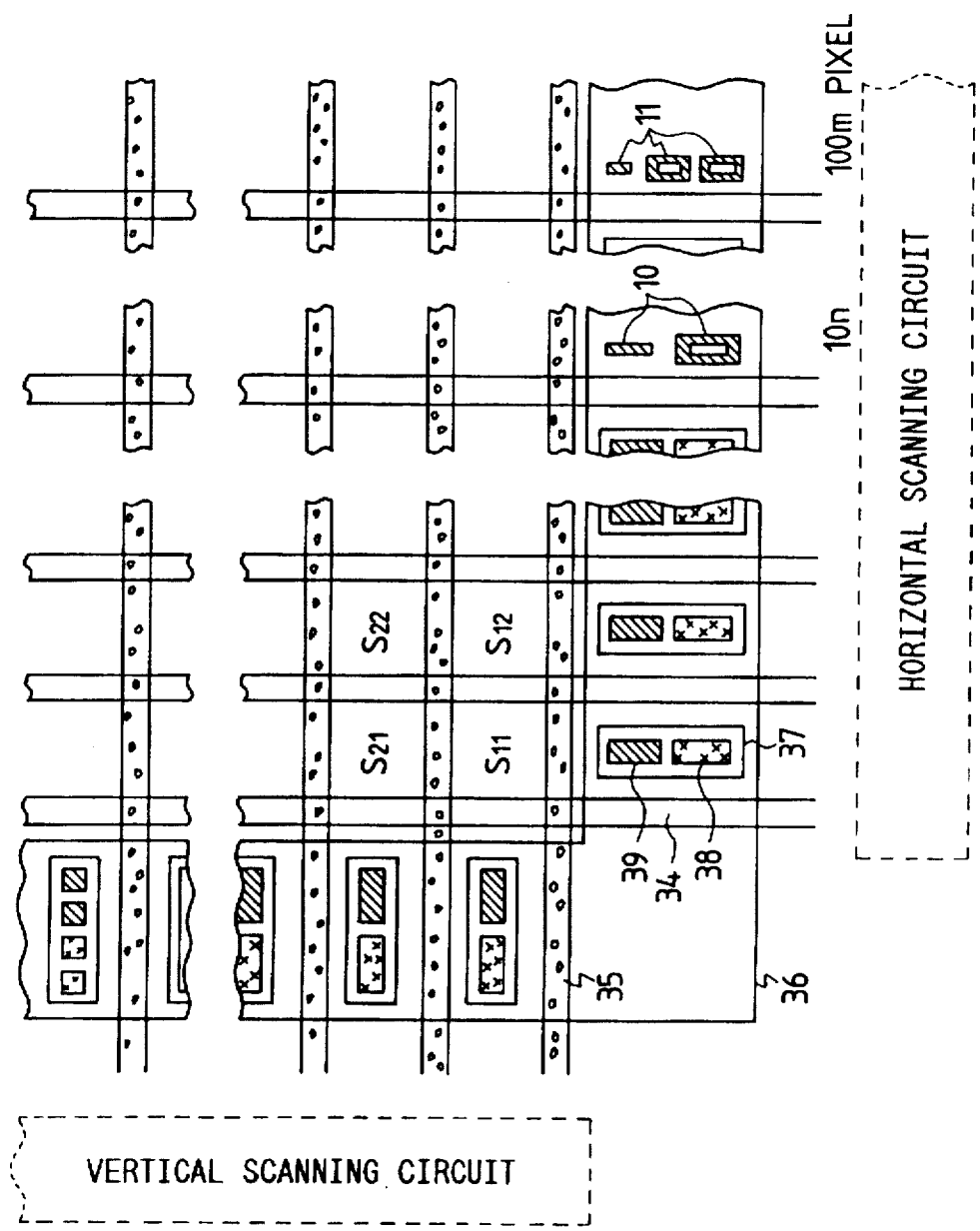
FIG. 3 shows a plan view of a third embodiment of the photo-electric conversion apparatus of the present invention.

FIG. 3 shows a third embodiment of the present invention. In the Embodiments 1 and 2, the pattern is used as the address index. In the present embodiment, a numerical pattern is formed.

In FIG. 3, numeral 10 denotes patterns "1" and "0" which indicate numeral "10" to form the address index for the tenth pixel. Similarly, numeral 11 denotes patterns "1", "0", "0" which indicate the address index for the 100th pixel. It should be understood that the numerical pattern may be inserted at any address.

In the present embodiment, since the numerical pattern is formed as the address index, the address identification may be made more clearly.

Embodiment 4

Figure 4:
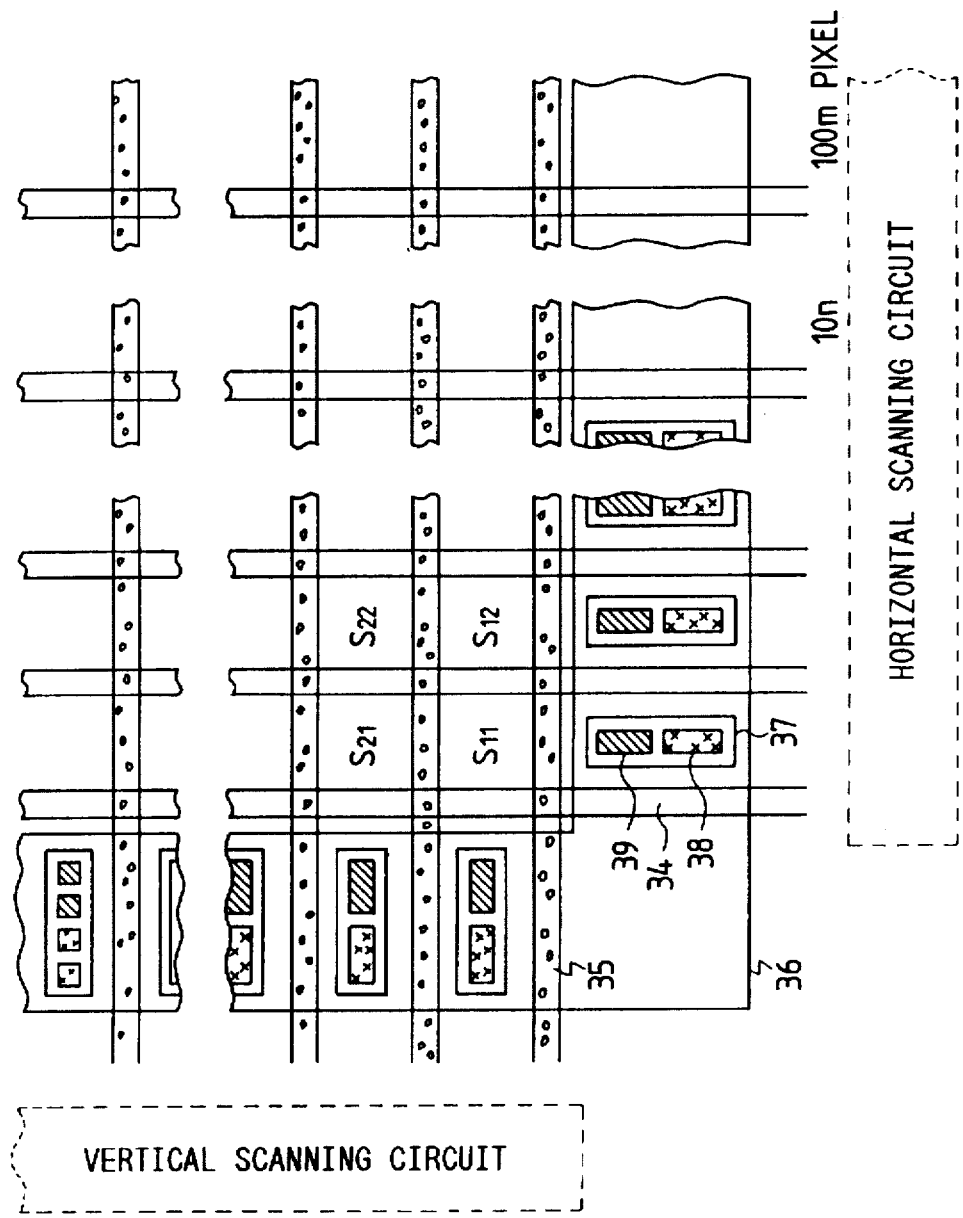
FIG. 4 shows a plan view of a fourth embodiment of the photo-electric conversion apparatus of the present invention.

In FIG. 4, the patterns 37, 38 and 39 which connect the power supply and the substrate at the 10n-th lines (n=1, 2, 3, ...) are removed. In this manner, the address of the pixel may be identified.

Embodiment 5

Figure 5:
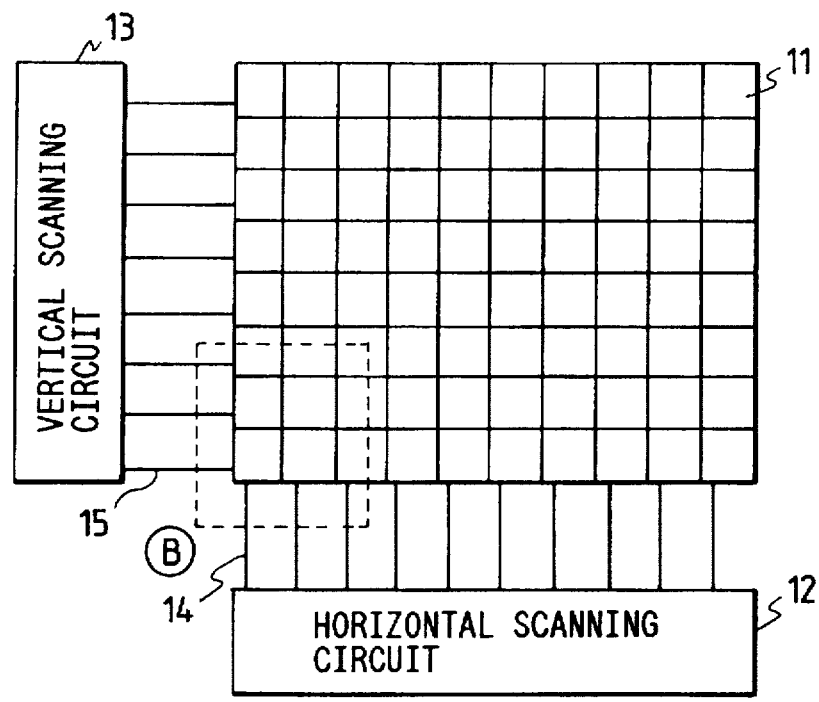
FIG. 5 shows a construction of a liquid crystal display device.
Figure 6:
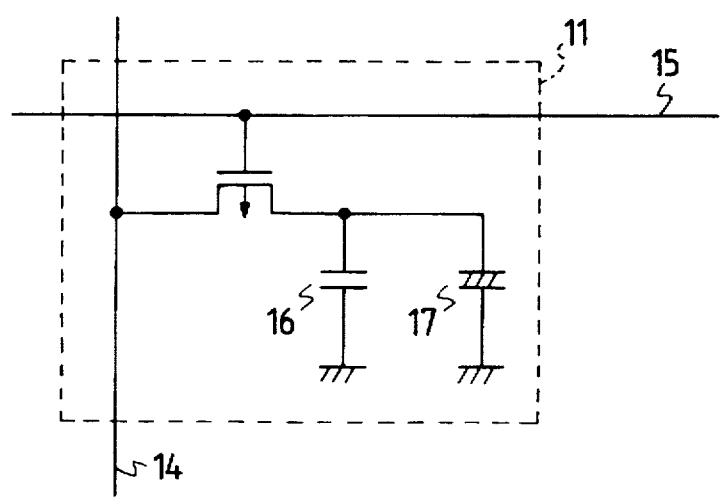
FIG. 6 shows a circuit diagram of pixels of the liquid crystal display device.
Figure 7:
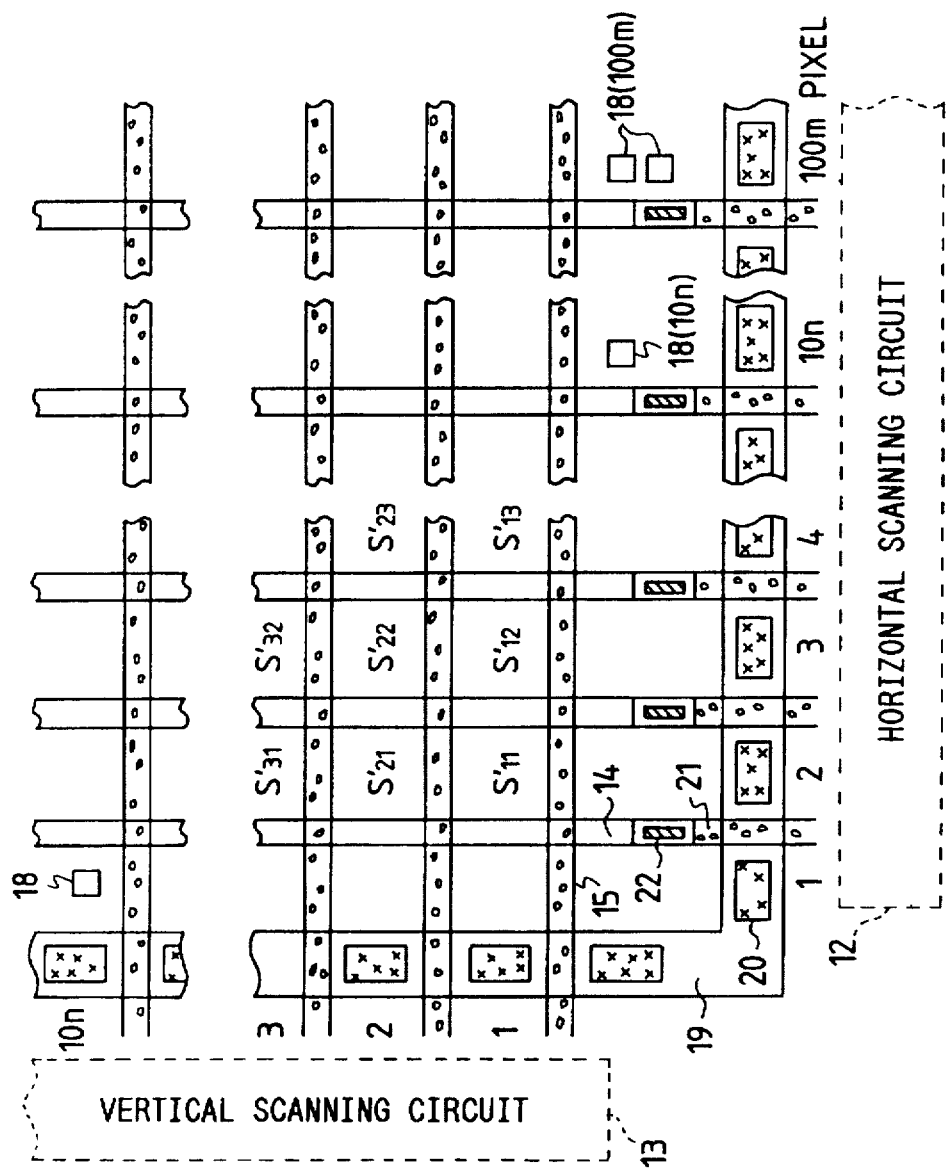
FIG. 7 shows a fifth embodiment of the liquid crystal display device of the present invention.

FIGS. 5 to 7 show a fifth embodiment of the present invention. In the present embodiment, it is applied to an XY matrix type liquid crystal display device.

FIG. 5 shows a schematic circuit configuration of the present embodiment. In FIG. 5, numeral 11 denotes a display pixel, numeral 12 denotes a horizontal scan circuit, numeral 13 denotes a vertical scan circuit, numeral 14 denotes a signal line and numeral 15 denotes a gate line.

FIG. 6 shows an equivalent circuit of the display pixel. In FIG. 6, numeral 16 denotes a load capacitance and numeral 17 denotes a liquid crystal capacitance. By the drive of the vertical scan circuit 13 and the horizontal scan circuit 12, signal voltages are written into the load capacitance 16 and the liquid crystal capacitance 17 of each pixel.

FIG. 7 shows an enlarged view of a portion circled by broken lines B in FIG. 6. Numeral 18 denotes an AL1 wiring which is a GND wiring to supply ground potential to the liquid crystal capacitance, numeral 20 denotes a throughhole TH for connecting the liquid crystal electrode and the GND wiring 18, numeral 21 denotes a poly-Si wiring which is a signal line, and numeral 22 denotes a contact CNT which connects the AL1 wiring 14 and the poly-Si wiring 21.

In the present embodiment, the index is formed at every tenth pixel and every 100th pixel by using the AL1 layer wiring.

In the present embodiment, the identification of the pixel fault in the liquid crystal display device is attained more exactly and in a shorter time than those of the prior art.

Embodiment 6

Figure 8:
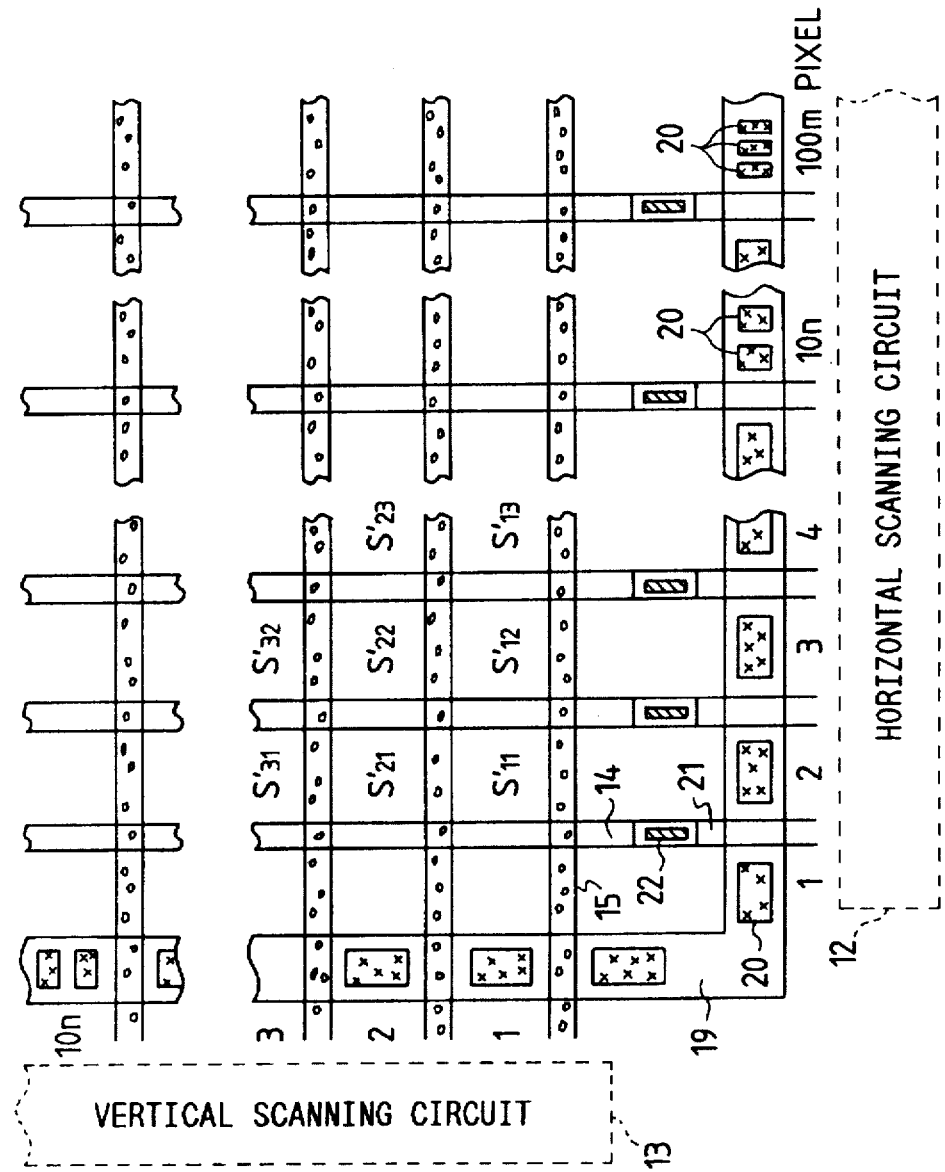
FIG. 8 shows a sixth embodiment of the liquid crystal display device of the present invention.
Figure 9:
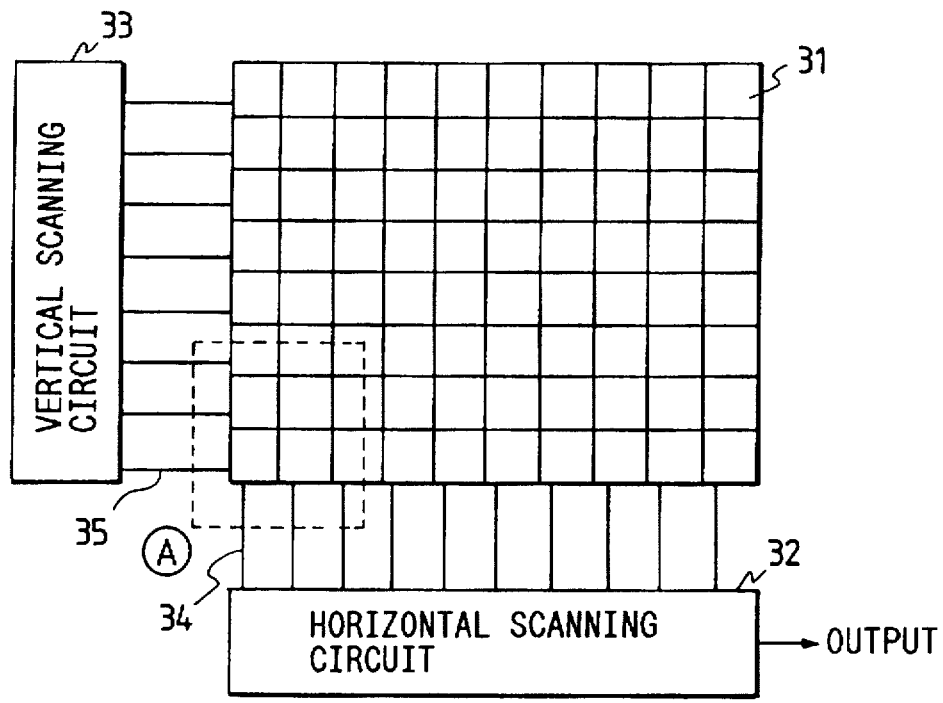
FIG. 9 shows a configuration of a prior art photo-electric conversion device.
Figure 10:
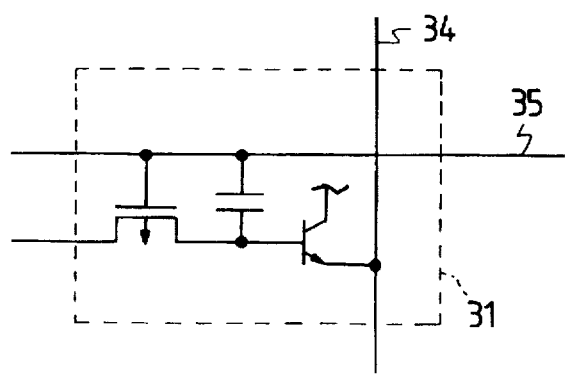
FIG. 10 shows a circuit diagram of pixels of a prior art photo-electric conversion device.
Figure 11:
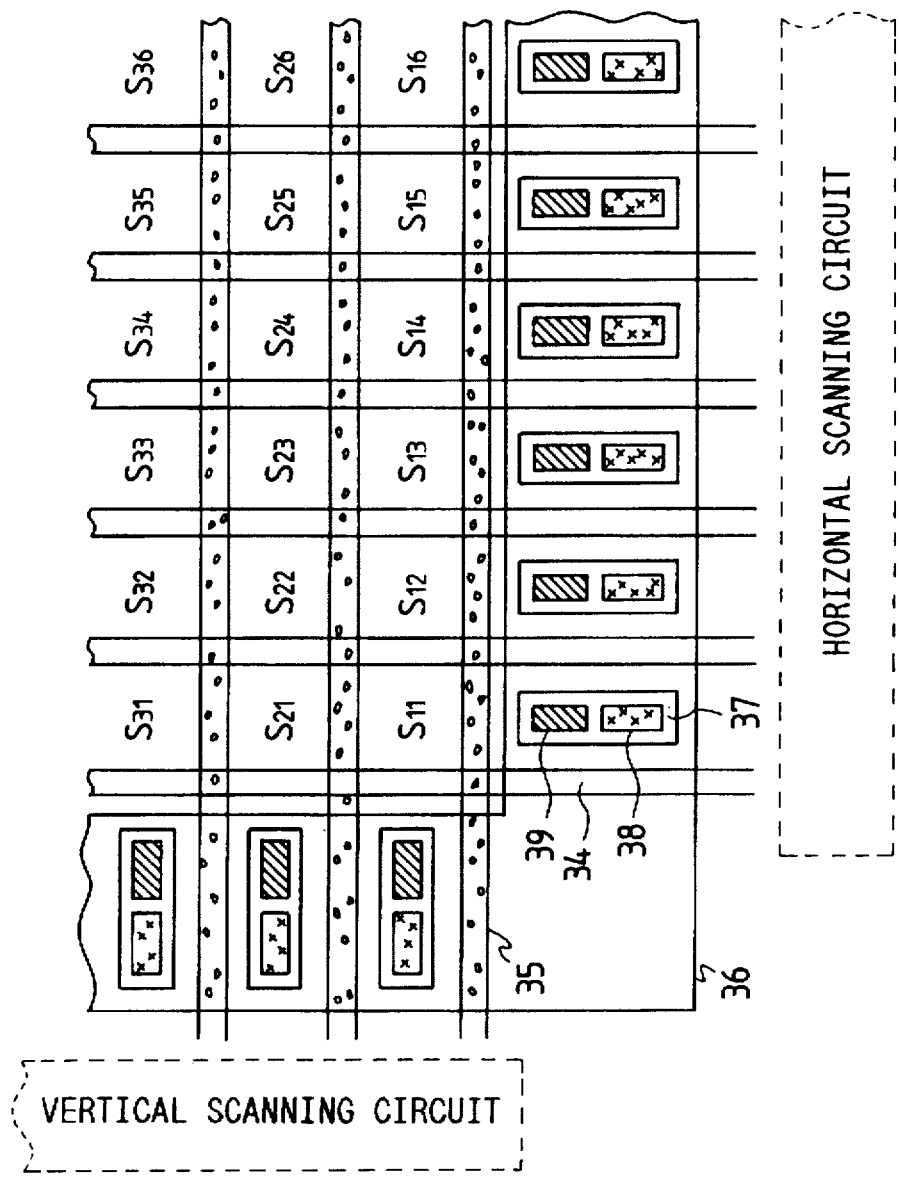
FIG. 11 shows a plan view of the prior art photo-electric conversion device.

FIG. 8 shows a sixth embodiment of the present invention. The present embodiment is applied to the liquid crystal display device as in the fifth embodiment. In the fifth embodiment, the address index is formed by using the AL1 layer wiring but in the present embodiment, the shape of the through-hole TH 20 which connects the liquid crystal electrode and the GND wiring 19 is changed to form the address index.

In the present embodiment, two through-holes TH's 20 are inserted for every tenth pixel (10n-th, n=1, 2, 3, ...) and three through-holes TH's 20 are inserted for every 100th pixel (100m-th, m=1, 2, 3, ...) to form the address index. In the present embodiment, the identification of the fault pixel address can be made exactly and in a short time.

The 10n-th pixel and the 100m-th pixel are not restrictive and any number of indices may be formed at any address.

Embodiment 7

Figure 19:
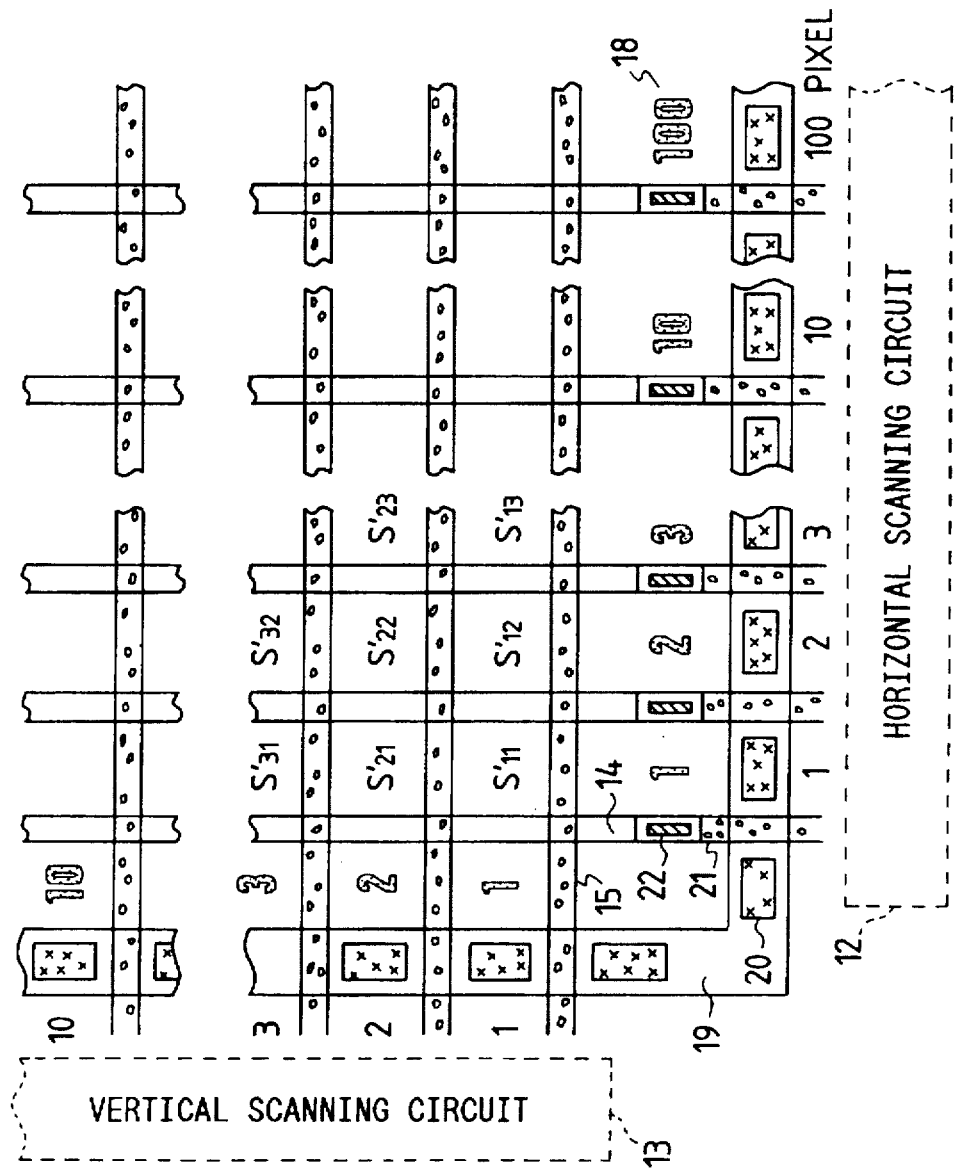
FIG. 19 shows a plan view of a seventh embodiment of the liquid crystal display device of the present invention.

FIG. 19 shows a plan view of a liquid crystal display device in accordance with a seventh embodiment of the present invention. In the present embodiment, in order to increase the speed of the external geometry test of the chip and improve the precision thereof, address indices 18 are formed at all rows and columns. In the present embodiment, the indices 18 are numerals in order to allow visual test.

Figure 20:
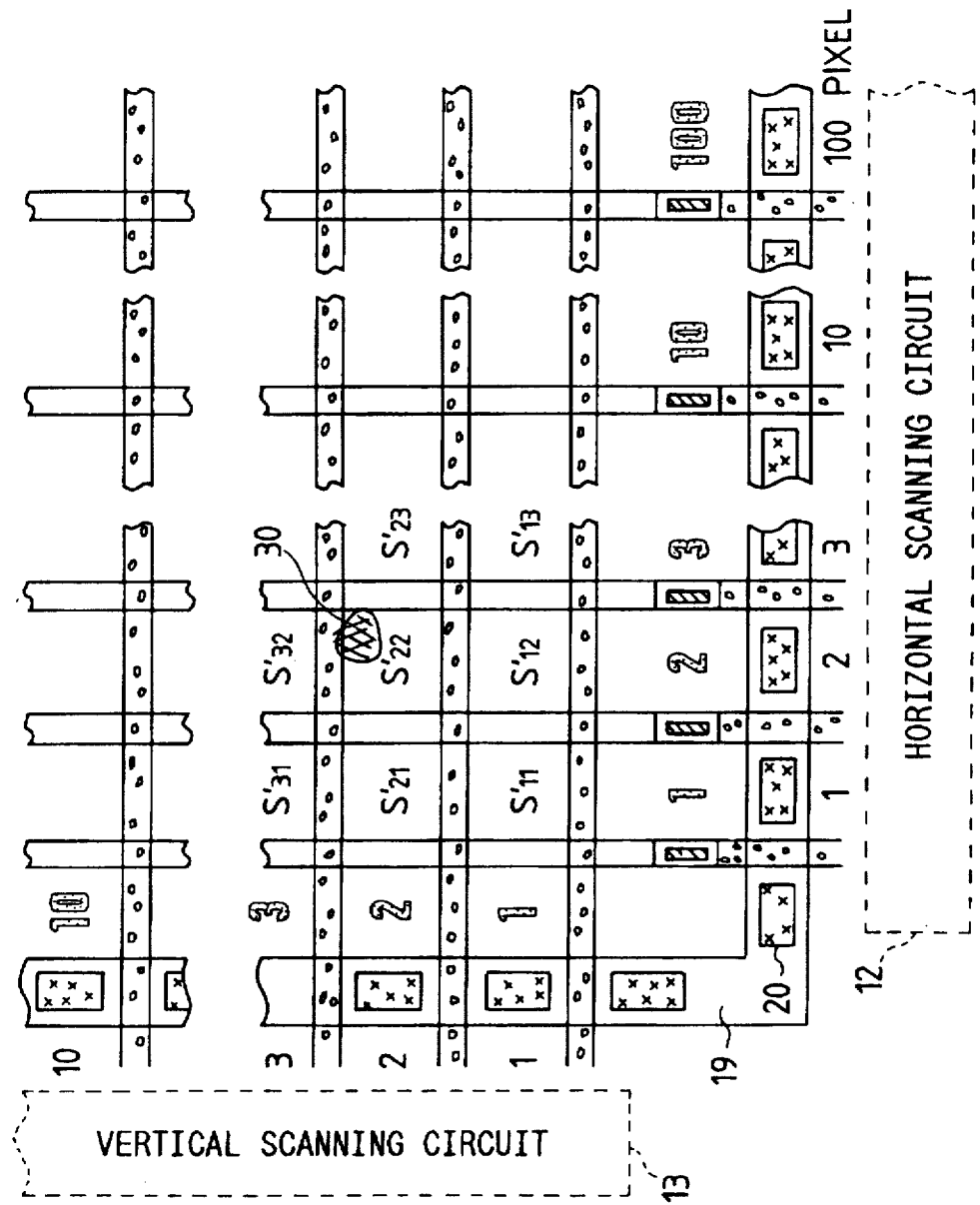
FIG. 20 shows a plan view of the seventh embodiment of the liquid crystal display device of the present invention.

As an example of the test method, the outer geometry is tested by a microscope in the shipment test, and if a foreign material 30 or a pattern defect is detected as shown in FIG. 20, the address index of the horizontal row and the vertical column of the defect pixel is read and it is entered in a test sheet. Since the address may be exactly identified, a countermeasure for electrical non-connection of a tester probe can be exactly made.

Embodiment 8

Figure 21:
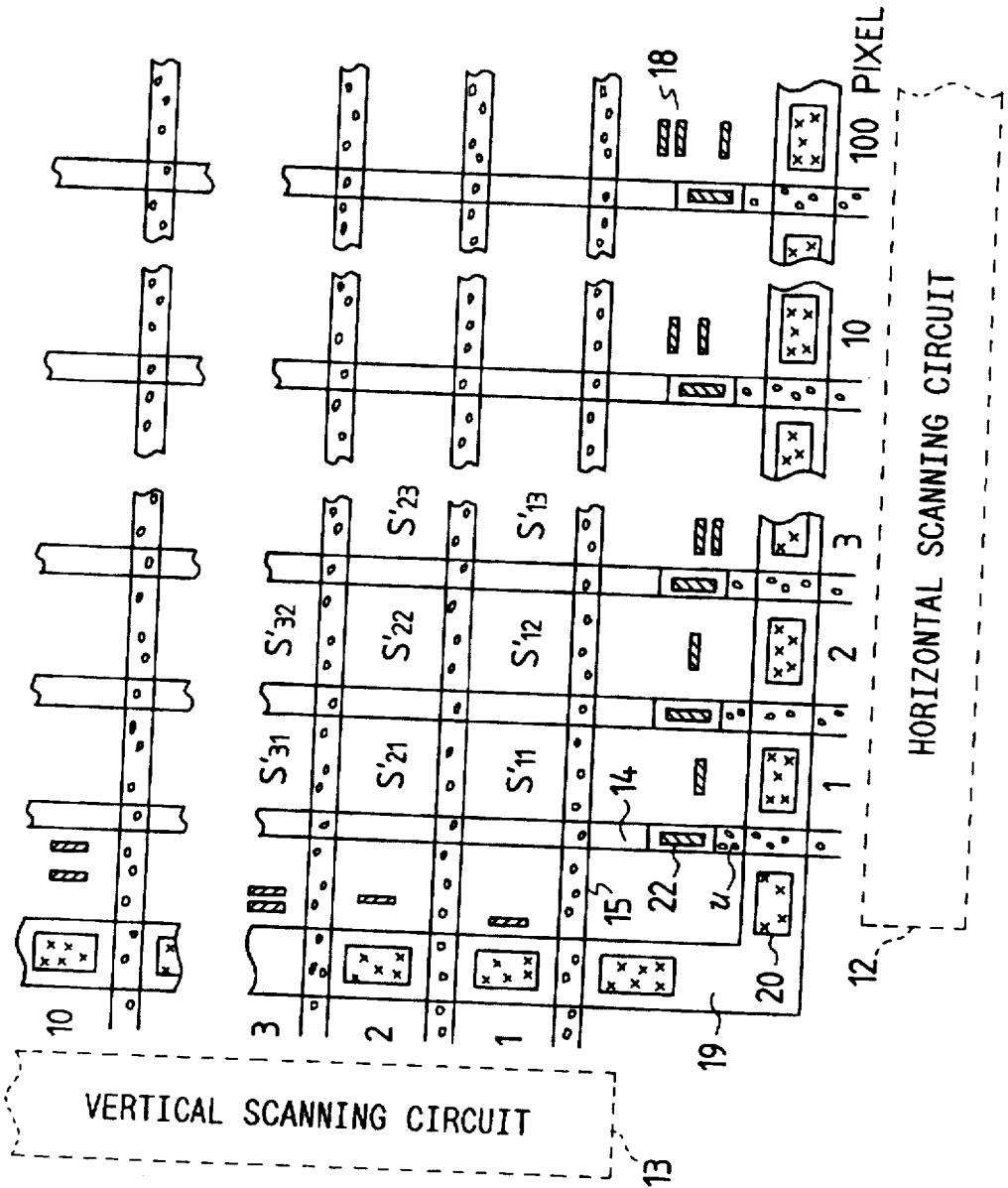
FIG. 21 shows a plan view of an eighth embodiment of the liquid crystal display device of the present invention.

FIG. 21 shows a plan view of a liquid crystal display device in accordance with an eighth embodiment of the present invention. In the present embodiment, the address index 18 is formed at each row and each column in a form of a bar code.

The present embodiment is suitable for the test by using an image recognition apparatus. FIG. 22 shows a flow chart of the operation and FIG. 23 shows a test system configuration. In the present system, the image data of the display pixel of the liquid crystal display device is read by an image input device and it is compared with the image data of a normal display pixel to determine the presence or absence of a foreign material and a size thereof. If the foreign material is detected, a scan is made in the X and Y direction and the address index 18 in the form of a bar code is written to identify the address.

In the present embodiment, since the foreign material detection is automated to form the address index in the liquid crystal display device, the defect detection is speeded up and the precision thereof is improved.

Embodiment 9

Figure 12:
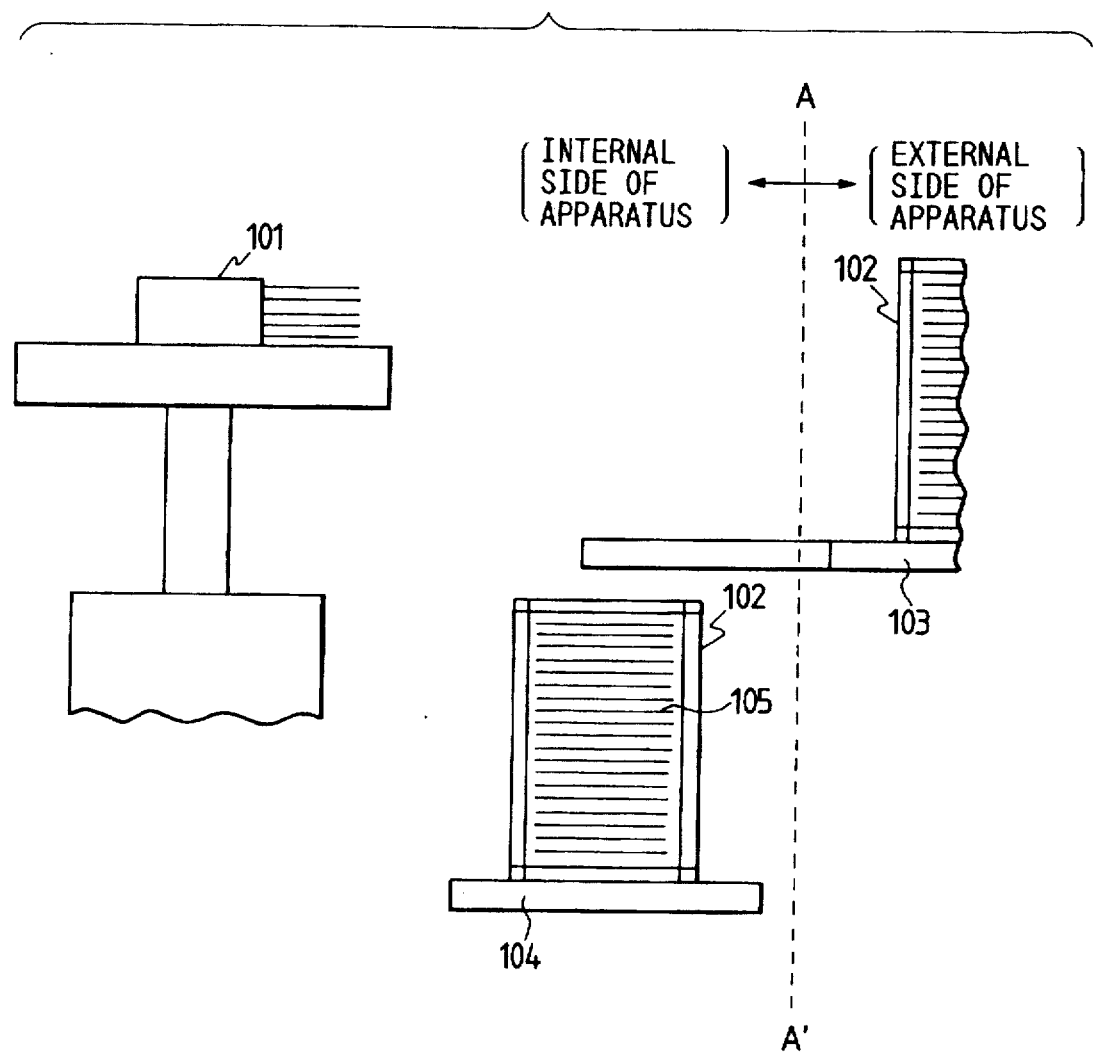
FIG. 12 shows a side view of a transport system of a vertical diffusion oven which embodies the present invention.

FIG. 12 shows a side view which best depicts a feature of a wafer transport apparatus of the present invention. In FIG. 12, numeral 101 denotes a wafer transport apparatus, numeral 102 denotes a wafer carrier, numeral 103 denotes an upper wafer carrier table, numeral 104 denotes a lower wafer carrier table and numeral 105 denotes a wafer.

Figure 13:
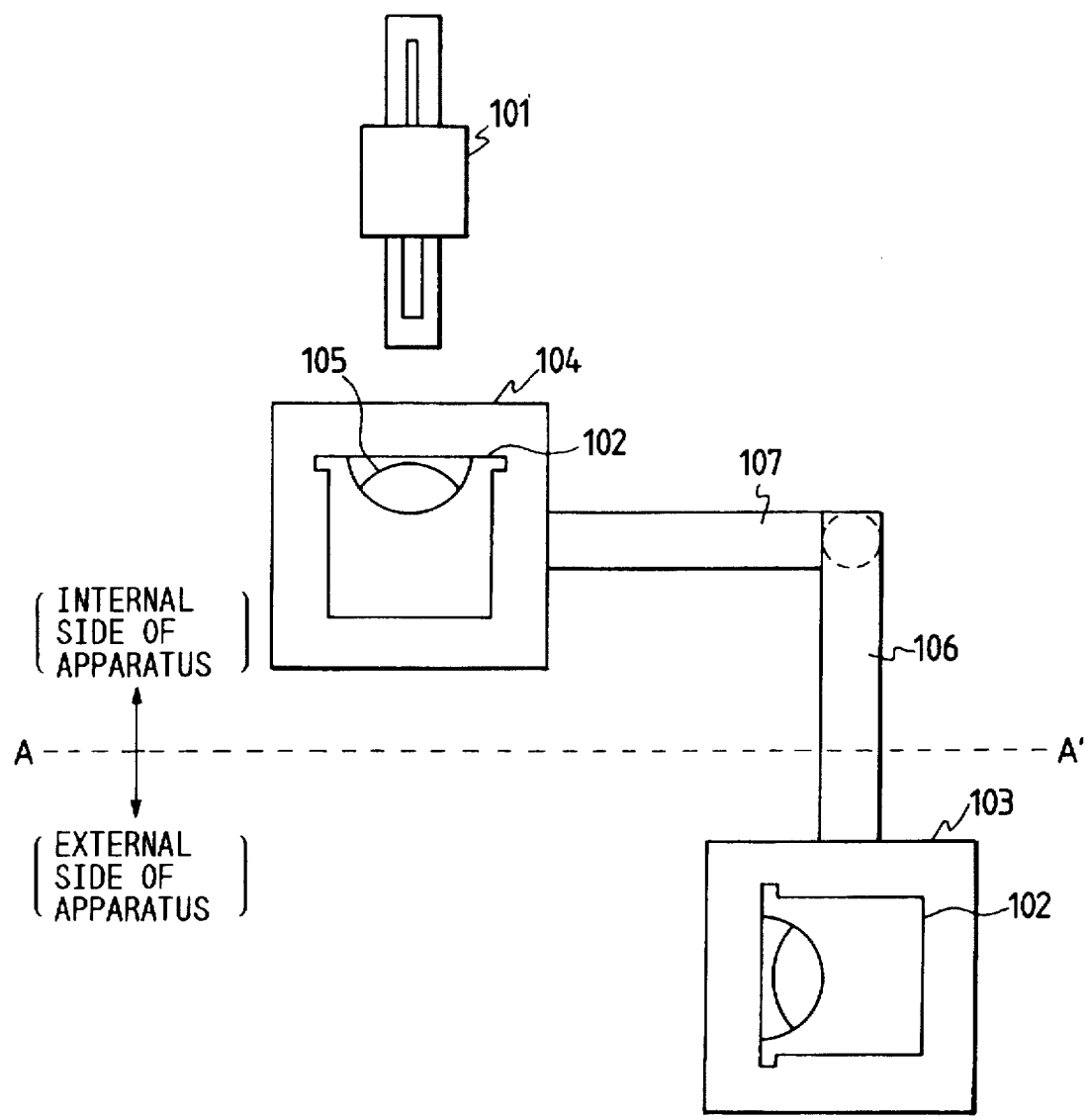
FIG. 13 shows a plan view of FIG. 12.

FIG. 13 shows a top view of FIG. 12. In FIG. 13, numeral 106 denotes a swing arm which support the upper wafer carrier table and numeral 107 denotes a swing arm which supports the lower wafer carrier table.

In FIGS. 12 and 13, a broken line A–A' is a border line for a semiconductor manufacturing apparatus. In the present embodiment, the upper and lower swing arms are located externally of the apparatus at the wafer set position so that they are not overlapped vertically.

Figure 14:
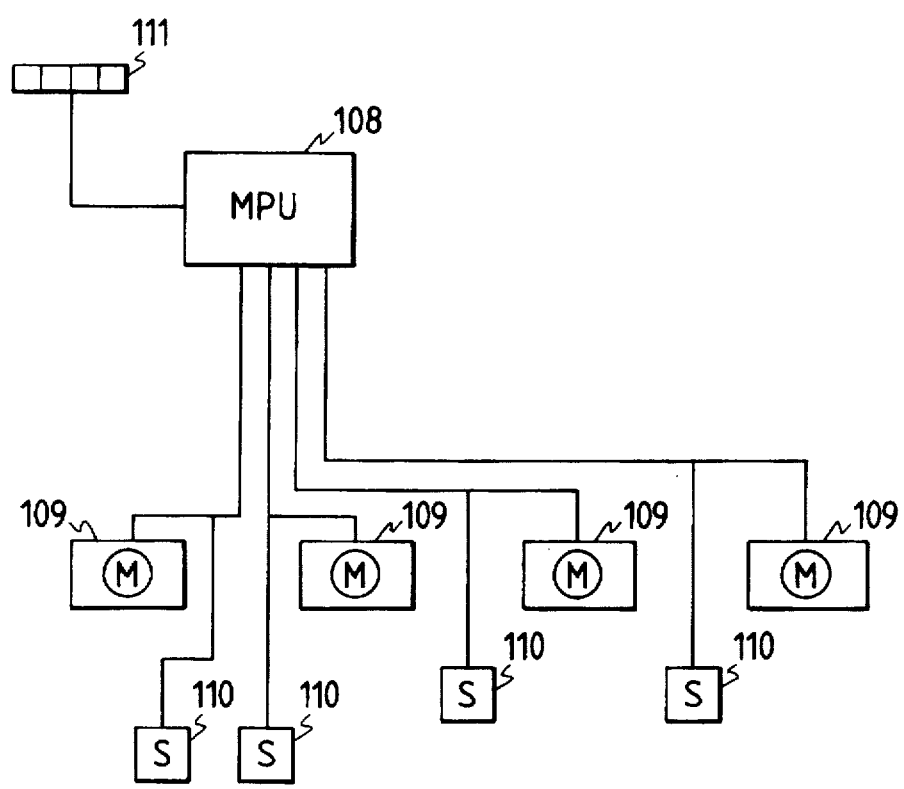
FIG. 14 shows a block diagram for electrically implementing the transport system of FIG. 12.

FIG. 14 shows a block diagram for implementing the wafer transport apparatus as shown in FIGS. 12 and 13. In FIG. 14, numeral 108 denotes an MPU (microprocessor), numeral 109 denotes a swing arm drive motor, and numeral 110 denotes a sensor for detecting a position of the swing arm. Numeral 111 denotes a switch for moving IN the swing arm (into the semiconductor manufacturing apparatus) and OUT (out of the semiconductor manufacturing apparatus). The MPU 108 processes the signals from the sensor 110 and the switch 111 and sends IN and OUT signals to the motor 109.

If any one of the four sensors 110 of FIG. 14 detects the OUT position of the swing arm, the MPU 108 controls operation such that the other swing arm is not driven to the OUT position even if the switch 111 is depressed.

A control operation to permit the swing arms which support the wafer carrier to move in the opposite directions, that is, inwardly and outwardly to the semiconductor manufacturing apparatus may be programmed in a memory (not shown) connected to the MPU.

In the present embodiment, since the wafer carriers moved by the swing arms are not positioned in vertical overlapped position at the wafer set position externally of the apparatus, contamination of the wafer by falling contaminant during the movement of the wafer is prevented.

Embodiment 10

Figure 15A:
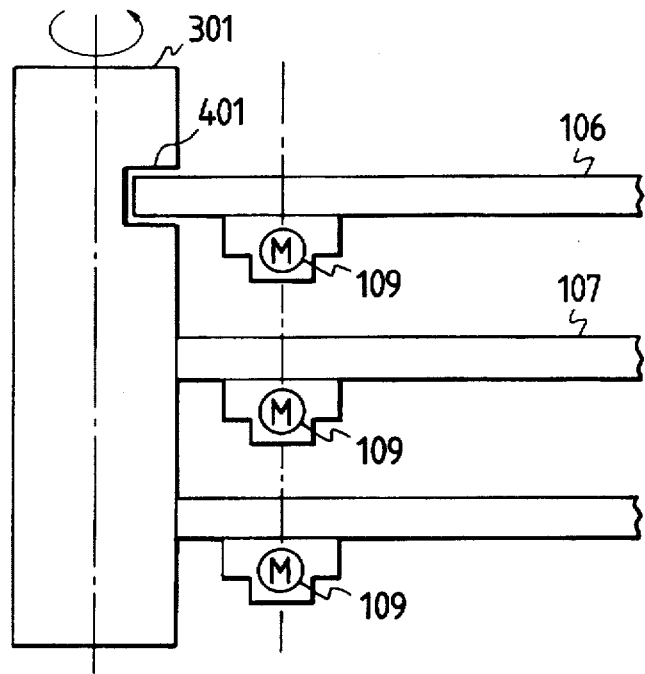
FIGS. 15A and 15B show constructions of an embodiment which mechanically implements the transport system of FIG. 12.
Figure 15B:
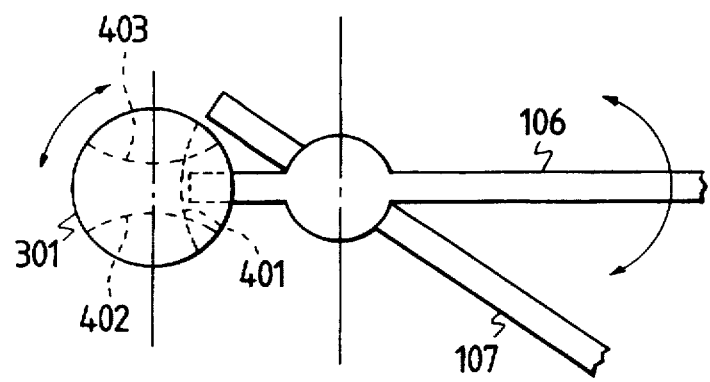
Figure 16A:
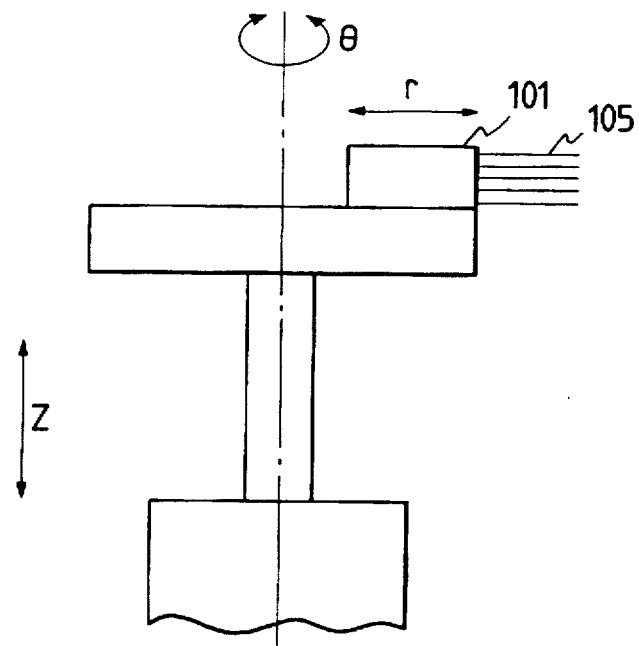
FIGS. 16A and 16B show constructions of a normally used transport apparatus.
Figure 16B:
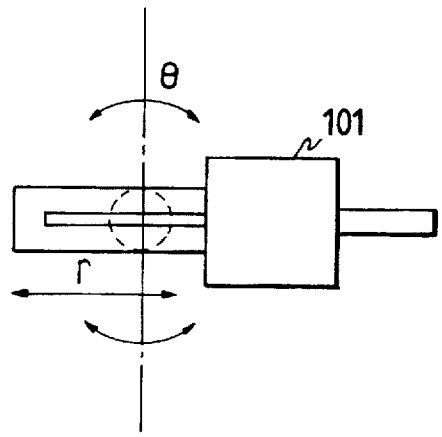
Figure 17A:
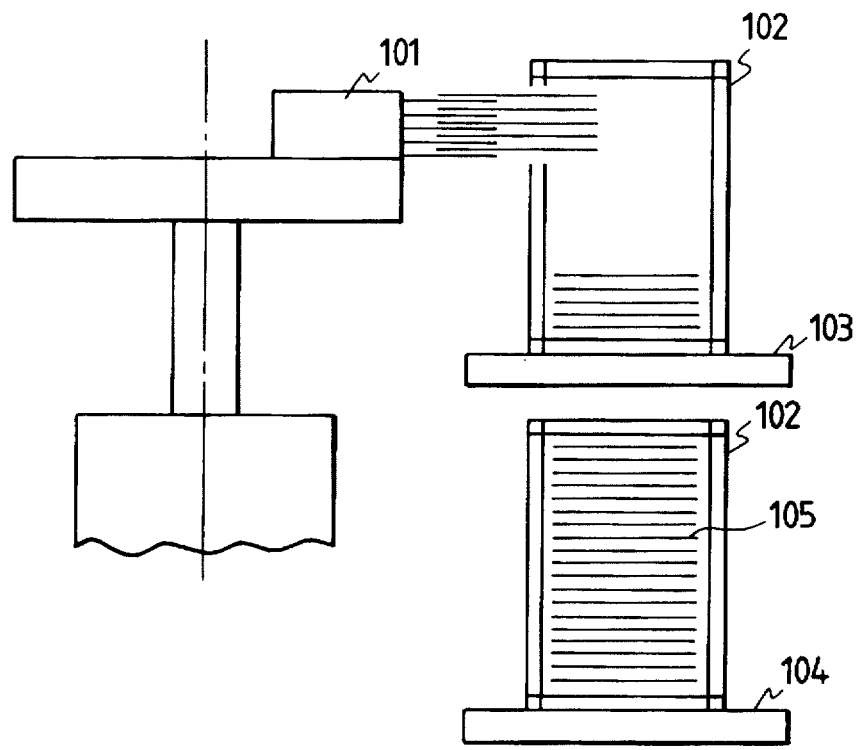
FIGS. 17A and 17B show detailed constructions of the apparatus of FIGS. 16A and 16B.
Figure 17B:
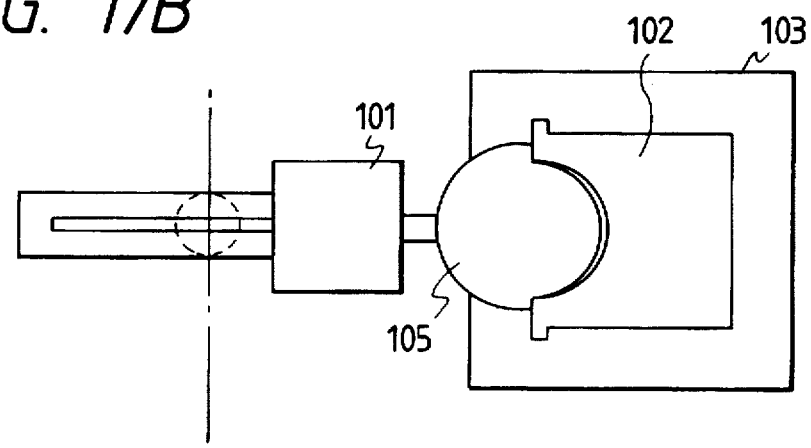
Figure 18:
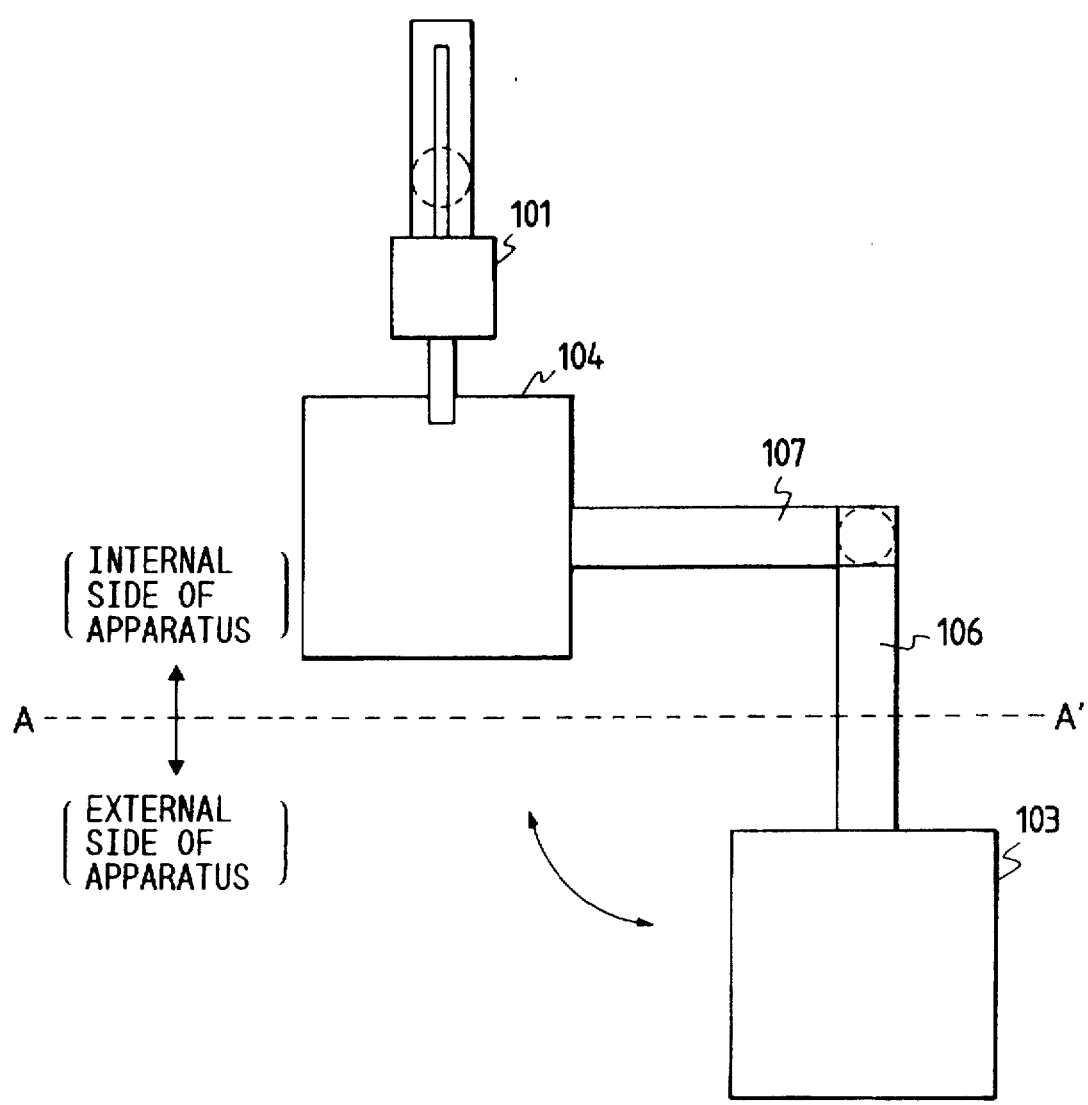
FIG. 18 shows a plan view for illustrating an operation of a wafer carrier mount table.

In the embodiment shown in FIGS. 12–14, the MPU electrically controls operation to prevent two or more swing arms from being driven to the OUT position simultaneously. Alternatively, operation may be mechanically controlled as shown in FIGS. 15A and 15B. FIG. 15A shows a side view of the present embodiment and FIG. 15B shows a top view thereof.

In FIGS. 15A and 15B, numerals 106 and 107 denote swing arms which support the upper and the lower wafer carrier tables, and numeral 109 denotes a motor for driving the swing arms 106 and 107. Numeral 301 denotes a cylinder for limiting the movement of the swing arms 106 and 107 and notches (401–403) at the levels corresponding to the swing arms 106 and 107 are formed in different directions. By rotating the cylinder 301, the operable swing arm may be selected but two or more swing arms are not simultaneously operable.

What is claimed is:

1. A semiconductor device comprising:

a plurality of elements arranged in one of a one-dimensional and a two-dimensional array; and indices, having different shapes, for identifying positions of said plurality of elements in said device provided on a semiconductor layer externally of said array of elements, and internally of a scanning circuit on the semiconductor layer.

2. A semiconductor device according to claim 1, wherein said element are pixels and said semiconductor device is a photo-electric conversion device.

3. A semiconductor device according to claim 1, wherein said elements are pixels and said semiconductor device is a liquid crystal display.

4. A semiconductor device according to claim 1, wherein said indices are provided at positions of contact sections of different configurations on the semiconductor layer.

5. A semiconductor device according to claim 1, wherein said indices are formed by a wiring material and function as wiring.

6. A semiconductor device according to claim 1, wherein said indices are through-holes of different shapes.

7. A semiconductor device according to claim 1, wherein said indices are contacts of different shapes.

8. A semiconductor device according to claim 1, wherein said indices are formed by omitting through-holes or contacts at specified positions.

9. A semiconductor device according to claim 1, wherein said indices are formed in a form of a bar code and a defect or a foreign material of said semiconductor device is detected by an image recognition apparatus.

* * * * *

UNITED STATES PATENT AND TRADEMARK OFFICE
CERTIFICATE OF CORRECTION

PATENT NO. : 5,760,421

DATED : June 2, 1998

INVENTORS : HIDEKAZU TAKAHASHI, ET AL.

It is certified that error appears in the above-identified patent and that said Letters Patent is hereby corrected as shown below:

COLUMN 3:

line 6, "Alternatively" should read --Alternatively,--.

COLUMN 4:

line 38, "characteristic" should read --characteristics--;
line 60, "designated" should read --are designated-- and "the like" should read --like--.

COLUMN 6:

line 41, "direction" should read --directions--; and
line 57, "support" should read --supports--.

COLUMN 8:

line 16, "element" should read --elements--.

Signed and Sealed this

Ninth Day of February, 1999

Attest:

Attesting Officer

*Acting Commissioner of Patents and Trademarks*